US008154985B1

(12) United States Patent
Smith, Jr. et al.

(10) Patent No.: US 8,154,985 B1
(45) Date of Patent: Apr. 10, 2012

(54) DOMAIN TRANSFORM COMPACTION AND RECOVERY

(75) Inventors: Harry E. Smith, Jr., Sunnyvale, CA (US); Russell K. Johnson, Half Moon Bay, CA (US); Rodelo M. Emett, Danville, CA (US)

(73) Assignee: Lockheed Martin Corporation, Bethesda, MD (US)

( * ) Notice: Subject to any disclaimer, the term of this patent is extended or adjusted under 35 U.S.C. 154(b) by 918 days.

(21) Appl. No.: 11/799,538

(22) Filed: May 2, 2007

(51) Int. Cl.
*H04J 11/00* (2006.01)
(52) U.S. Cl. ....................................... 370/210
(58) Field of Classification Search .......... None
See application file for complete search history.

(56) References Cited

U.S. PATENT DOCUMENTS

| 7,634,525 | B2 * | 12/2009 | Hou | 708/400 |
| 8,045,654 | B1 * | 10/2011 | Anderson | 370/210 |
| 2007/0143118 | A1 * | 6/2007 | Chen et al. | 704/500 |
| 2008/0175422 | A1 * | 7/2008 | Kates | 381/316 |

* cited by examiner

*Primary Examiner* — Anh-Vu Ly
(74) *Attorney, Agent, or Firm* — Oliff & Berridge, Plc

(57) ABSTRACT

Disclosed are exemplary apparatus, techniques, algorithms and methods for reducing the size of time domain data with minimal distortion. In general, the exemplary techniques use a digital channelizer to convert a time series in to a set of frequency bins. Frequency bins that have a power less than a predefined threshold are converted to zero. The frequency domain data is then compressed using a compression routine. The compressed frequency domain data may be stored or transmitted. Recovery of the time domain data involves reversing the compaction process. Since the digital channelizer produces perfect reconstruction of the time signals, little distortion of the time domain signals occurs.

12 Claims, 2 Drawing Sheets

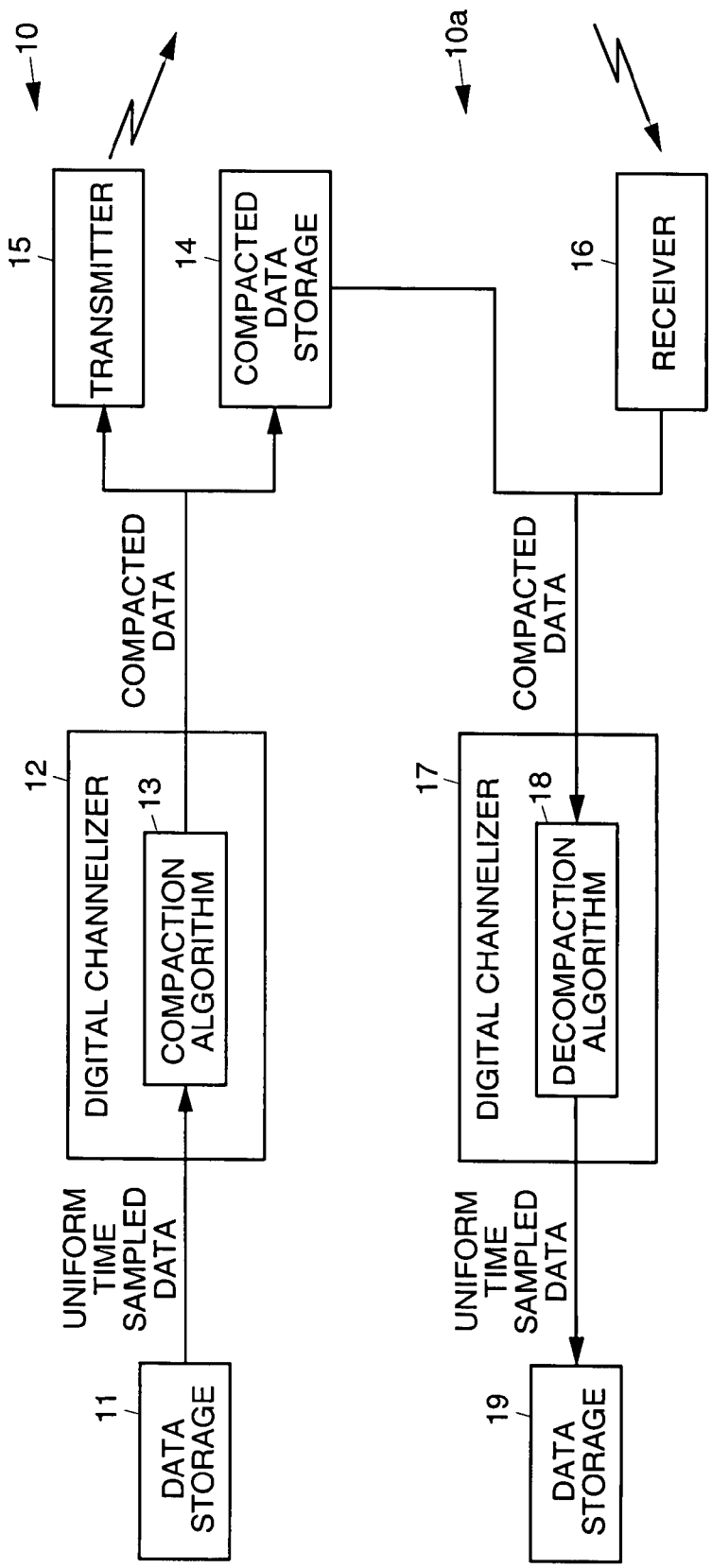

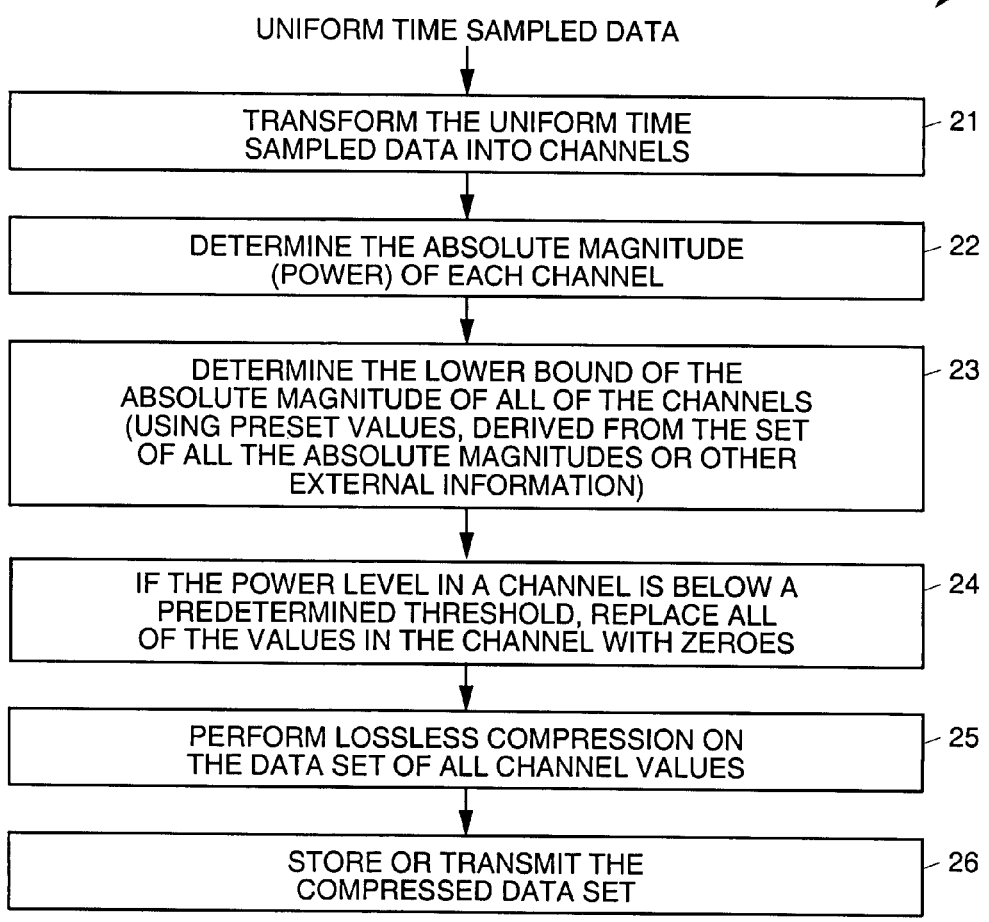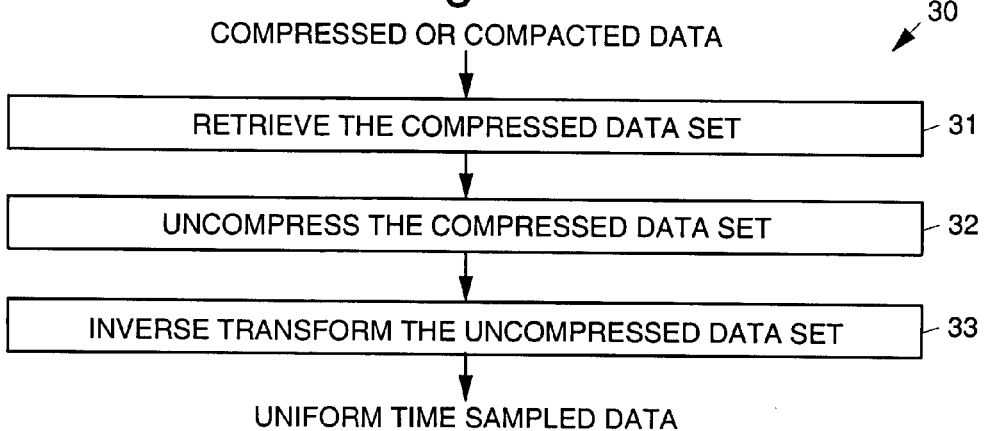

DOMAIN TRANSFORM COMPACTION AND RECOVERY

BACKGROUND

The present invention relates generally to techniques for reducing the size of time domain data with minimal distortion.

A uniformly sampled data set of a continuous time based function $f(t)$ is defined as:

$$\left\{ f(x_i) \middle| \begin{array}{l} x_i \in \text{domain of } f \\ \text{and } \|x_{i+1} - x_i\| = \kappa \\ \text{and } \frac{1}{\kappa} \geq 2 * \text{Maximum Frequency of Interest} \end{array} \right\}$$

The uniformly sampled data may also be called a time sampled representation of $f(t)$. Nyquist proved that a time based function can be reconstructed perfectly from a time series data set if the sampling is greater than twice the maximum frequency. However, this method can require very large amounts of data storage.

For example, a speaker's energy spectrum is usually limited to less than 20 KHz. Thus, a uniformly sampled data set for speech would require a sampling rate at least 40 K samples per second. Using 16 bits to account for dynamic range means that every second of music requires 80 KB. Medical ultrasound, which uses frequencies as high as 20 MHz, needs 40 million samples per second for perfect reconstruction. Using the same dynamic range as music means that a medical ultrasound would generate 80 MB/s of uniform time sampled data. Imagery data can require both larger dynamic range and higher sampling rates.

However, if one has a uniform time sampled data set and does not need perfect reconstruction of the time-based function, the size of the representative data set can be reduced?

Techniques to that reduce the size of the uniform time sampled data set and allow perfect reconstruction of the time-based function are called lossless compression techniques. Techniques that reduced the size of the uniform time sampled data set but do not provided perfect reconstruction of the time-based function are called compaction or lossy compression techniques.

Thus, the problem is how to reduce the size of the time data set using compaction while having minimal differences between the original time-based function and the reconstructed time-base function. It would be desirable to have a technique or algorithm that solves this problem.

Several algorithms exist that allow lossless compression of a uniformly time sampled data set, such as zip, and bzip2. In addition, techniques exist for compacting uniform time sampled data sets, such as eliminating every other sample point (decimation). Decimation effectively reduces the frequency range of the reconstructed time-based function; and may cause distortion due to frequency aliasing. For example, if the maximum frequency range for music is reduced from 20 KHz to 10 KHz by decimating by 2, the quality of the music would be unacceptable because all energy above 5-Hz is aliased.

Thus, the problem transforms into how to reduce the size of the uniformly time sampled data set while maintaining the full frequency range and minimizing the distortion (differences) between the original time-based function and the reconstructed time-based function.

Existing compaction techniques require prior knowledge of the internal structure of the time-based function. For example, techniques exist to eliminate non-clarinet sounds in a uniformly time sampled music data set. The reconstructed time-based function only contains the sounds of the clarinet. However, this is a problem if someone is interested in a trumpet part.

Since there is no prior knowledge of the internal structure of the time-base function, another type of technique is required. Since it is desired to minimize the distortion between the original time-based function and the reconstructed time-based function, the present inventors investigated available techniques.

The most promising techniques involved the use of dual spaces. If one looks to functional analysis, there exists a set of function space transforms that convert one functional space to a new functional space. In particular, the functional space transforms of interest are Laplace transforms. Fourier transforms are one example of Laplace transforms.

Techniques involving filtering of a continuous time-based function in a dual space provide a needed internal structure based on the transformed time-based function. This structure requires no knowledge of internal structure of the time-based function. The frequency domain signal may be viewed as a filtering operation uses overlapping Quadrature Mirror Filtering (QMF), for example, which allow perfect reconstruction when converting back to the time domain.

These techniques are applicable to a uniformed time sampled data set derived from a continuous time-based function. These techniques have been implemented using Fourier transforms in transponder satellites using digital channelizers. However, no known technique has used channelizing techniques as a means for compacting data.

It would be desirable to have apparatus, methods, techniques or algorithms for compacting (reducing the size) and decompacting (recovering) time domain data with minimal distortion.

BRIEF DESCRIPTION OF THE DRAWINGS

The various features and advantages of the present invention may be more readily understood with reference to the following detailed description taken in conjunction with the accompanying drawings, wherein like reference numerals designate like structural elements, and in which:

FIG. 1 illustrates exemplary data compaction and decompaction apparatus;

FIG. 2 is a flow diagram that illustrates an exemplary data compaction technique, algorithm, or method for reducing the size of time domain data with minimal distortion; and FIG. 3 is a flow diagram that illustrates an exemplary data decompaction or data recovery technique, algorithm, or method.

DETAILED DESCRIPTION

Disclosed herein are exemplary apparatus, techniques, algorithms and methods for reducing the size of time domain data with minimal distortion. In general, the exemplary apparatus, techniques, algorithms and methods use a digital channelizer to convert a time series in to a set of frequency bins. Using either an adaptive approach or pre-defined values, frequency bins that have a power less than a predefined threshold are converted to zeroes (0). A compression routine is then used to compress the frequency domain data. The compressed frequency domain data may be stored or transmitted. Recovery of the time domain data from the compressed frequency domain data involves reversing of the compaction process. Since the digital channelizer is designed to produce perfect reconstruction of the time signals, little distortion of the time domain signals occurs.

No similar techniques are known. All known uses for digital channelizers have involved reconstruction or demodulation of time domain waveforms. All other known compaction schemes involve straight compression of all of the data including noise, or depend upon demodulation of the time series information. By not requiring demodulation, later analysis of the time domain information is possible.

Referring to the drawing figures, illustrates exemplary data compaction apparatus 10 and decompaction apparatus 10a. The exemplary data compaction apparatus 10 comprises a data storage device 11 that stores time domain data. The data storage device 11 is coupled to a digital channelizer 12 that is used to uniformly sample data derived from the storage apparatus 11. The design and construction of the digital channelizer 12 is generally well-known in the art. An exemplary digital channelizer 12 is described in "Multirate Digital Signal Processing" by Ronald E. Crochiere and Lawrence R. Rabiner, 1983, Prentice Hall, Section 7.2.5, pp 313-325.

The digital channelizer 12 comprises a compaction algorithm 13 that processes the uniformly sampled data to reduce the size of the time domain data. The compaction algorithm 13 transforms uniform time sampled data into frequency bins of a plurality of frequency channels. The compaction algorithm 13 retrieves a predetermined number of values from a data set of frequency bins comprising each frequency channel. The compaction algorithm 13 determines the absolute magnitude of each frequency channel. The compaction algorithm 13 determines the lower bound of the absolute magnitude of all of the frequency channels. The compaction algorithm 13 replaces all of the values in the frequency channel with zeroes if the power level in a frequency bin is below a predefined threshold. The compaction algorithm 13 processes the data set of all channel values using a lossless compression algorithm to reduce the size of time domain data.

The compacted data may be stored in a compacted data storage device 14 (which may be a portion of the data storage device 11) and/or the compacted data may be transmitted by way of a transmitter 15.

The decompaction apparatus 10a may comprise a receiver 16 for receiving transmitted compacted data or may be coupled to the compacted data storage device 14. The decompaction apparatus 10a comprises a digital channelizer 17 that receives compacted data that has been received by the receiver 16 or compacted data obtained from the compacted data storage device 14. The digital channelizer 17 comprises a decompaction algorithm 18 that processes the compacted data to generate time domain data. The decompaction algorithm 18 uncompresses the compacted data. The decompaction algorithm 18 then inverse transforms the uncompressed data to recover the time domain data. The recovered time domain data may be stored or otherwise processed.

FIG. 2 is a flow diagram that illustrates an exemplary data compaction technique 20, algorithm 20, or method 20 for reducing the size of time domain data with minimal distortion. The exemplary method 20 involves the following procedures.

The compaction algorithm 20 transforms 21 uniform time sampled data into channels. The first $2^n$ values, for example, are fetched 22 or retrieved 22 from each data set. The absolute magnitude (power) of each channel is determined 23 using the retrieved data values. The lower bound of the absolute magnitude of all of the channels is determined 24. Possible mechanisms for determining the lower bound may use preset values, derived from the set of all the absolute magnitudes, or determined for other external information, such as black body radiation calculation, or measured values for example. If the power level in a channel is below a predefined threshold, all of the values in the channel are replaced 25 with zeroes (0). A lossless compression mechanism algorithm is used to process 26 the data set of all channel values. The compressed data of the channel values may be used as any other data set. Thus, the data may be stored 27 or transmitted 27, for example.

FIG. 3 is a flow diagram that illustrates an exemplary data decompaction or data recovery technique 30, algorithm 30, or method 30. The decompaction algorithm 30 generally reverses the compaction procedure. The compressed version of the compacted data set is received 31 or retrieved 31. The compacted data set is uncompressed 32. The channelized version of the data set is inverse transformed 33 to recover the time domain data.

The above-described technique 20 or algorithm 20 has several advantages over known methods. The amount of distortion in the time series can be controlled by changing the threshold algorithms. The more bands deleted the more likely that there will be distortion in the time series data. The resolution of the frequency domain bins is controlled by the characteristics of the channelizer. Increasing the number of bins in the frequency bins reduces the bandwidth of the channels.

The algorithm 20 has been demonstrated using transforms from the time domain to the frequency domain. In the particular data of interest, a compaction ratio of 30 to 60 to one has been shown. The mathematics involved indicate that the algorithm can be extended to multi-dimension transforms. For example, images can be converted to the spatial frequency domain for compaction.

Thus, apparatus, methods, algorithms and techniques for reducing the size of time domain data with minimal distortion have been disclosed. It is to be understood that the above-described embodiments are merely illustrative of some of the many specific embodiments that represent applications of the principles disclosed herein. Clearly, numerous and other arrangements can be readily devised by those skilled in the art without departing from the scope of the invention.

What is claimed is:

1. Apparatus comprising:
  storage apparatus for storing time domain data;
  a digital channelizer processor for processing uniform time-sampled data derived from the storage apparatus, the digital channelizer processor transforms uniform time-sampled data into frequency bins of a plurality of frequency channels, retrieves a predetermined number of values from a data set of frequency bins comprising each frequency channel, determines an absolute magnitude of each frequency channel, determines a lower bound of the absolute magnitude of all of the frequency channels, replaces values in a frequency channel with zeroes if a power level in a frequency bin of the frequency channel is below a predefined threshold, and processes the data set of all channel values using a lossless compression algorithm to reduce the size of the time domain data.

2. The apparatus recited in claim 1 wherein the digital channelizer processor determines the lower bound of the absolute magnitude of the frequency channels using preset values derived from the set of absolute magnitudes.

3. The apparatus recited in claim 1 wherein the digital channelizer processor determines the lower bound of the absolute magnitude of all frequency channels using preset values derived from external information.

4. The apparatus recited in claim 1 further comprising apparatus for storing the compressed data.

5. The apparatus recited in claim 1 further comprising apparatus for transmitting the compressed data.

6. The apparatus recited in claim 1 further comprising:
a second digital channelizer processor for receiving compacted data, uncompressing the compacted data, and inverse transforming the uncompressed data to recover the time domain data.

7. A method comprising:
transforming by a digital channelizer processor uniform time sampled data derived from a storage apparatus into frequency channels;
retrieving by the digital channelizer processor a predetermined number of values from a data set comprising each frequency channel;
determining an absolute magnitude of each frequency channel;
determining a lower bound of the absolute magnitude of all frequency channels;
if a power level in a frequency channel is below a predefined threshold, replacing all of the values in the frequency channel with zeroes;
processing the data set of all channel values by the digital channelizer processor using a lossless compression algorithm to compact the time domain data.

8. The method recited in claim 7 wherein determining the lower bound of the absolute magnitude of all channels uses preset values derived from a set of all absolute magnitudes.

9. The method recited in claim 7 wherein determining the lower bound of the absolute magnitude of all channels uses preset values derived from external information.

10. The method recited in claim 7 further comprising storing the compacted data.

11. The method recited in claim 7 further comprising transmitting the compacted data.

12. The method recited in claim 7, wherein the digital channelizer processor is a first digital channelizer processor, further comprising:
receiving or retrieving compacted data by a second digital channelizer processor;
uncompressing the compacted data; and
inverse transforming the uncompressed data to recover the time domain data.

* * * * *